United States Patent
Koji

(10) Patent No.: US 7,639,543 B2
(45) Date of Patent: Dec. 29, 2009

(54) HIGH SPEED CASCODE CIRCUIT WITH LOW POWER CONSUMPTION

(75) Inventor: Shimbayashi Koji, Aichi-Ken (JP)

(73) Assignee: Spansion LLC, Sunnyvale, CA (US)

( * ) Notice: Subject to any disclaimer, the term of this patent is extended or adjusted under 35 U.S.C. 154(b) by 92 days.

(21) Appl. No.: 11/986,509

(22) Filed: Nov. 20, 2007

(65) Prior Publication Data
US 2008/0144385 A1 Jun. 19, 2008

Related U.S. Application Data

(63) Continuation-in-part of application No. PCT/JP2006/340294, filed on Dec. 18, 2006.

(51) Int. Cl.
*G11C 11/34* (2006.01)
(52) U.S. Cl. ............................... 365/185.21; 365/185.2
(58) Field of Classification Search ............ 365/185.21, 365/185.2, 207
See application file for complete search history.

(56) References Cited

U.S. PATENT DOCUMENTS

| | | | |
|---|---|---|---|
| 6,351,416 B2 | 2/2002 | Fuchigami et al. | 365/185.21 |
| 6,356,065 B1 | 3/2002 | Miyazaki | 323/315 |
| 6,504,761 B2 | 1/2003 | Kai et al. | 365/185.2 |
| 6,611,468 B2 * | 8/2003 | Nojiri et al. | 365/207 |
| 7,057,944 B2 * | 6/2006 | Ito et al. | 365/189.15 |
| 7,359,247 B2 * | 4/2008 | Motoki | 365/185.2 |
| 7,542,348 B1 * | 6/2009 | Kim | 365/185.21 |

FOREIGN PATENT DOCUMENTS

JP  01-098195  4/1989

* cited by examiner

*Primary Examiner*—Anh Phung

(57) ABSTRACT

A nonvolatile memory device capable of: preventing variations in current and transistor properties to prevent data readout errors; facilitating design changes with a simplified adjustment of the current ratio of transistors; and achieving increased data reading speed. The memory device comprising: a first current detecting circuit comprising a first transistor of a first conductive type coupled in a diode configuration, wherein current flows according to a reference cell through the first transistor; a second current detecting circuit comprising a second transistor of the first conductive type coupled in a diode configuration, wherein current flows according to a selected memory cell through the second transistor; a bias circuit comprising a third transistor of the first conductive type that is coupled to the first transistor by a current mirror configuration; and a differential amplifying circuit comprising a fourth transistor of the first conductive type which is coupled to the second transistor, wherein the differential amplifying circuit outputs a signal corresponding to a difference between current flowing through the third transistor and current flowing through the fourth transistor; and wherein the first transistor, the second transistor, the third transistor and the fourth transistor are comprised of one predetermined sized unit transistor element of the first conductive type, or are comprised of parallel couplings of predetermined sized unit transistor elements of the first conductive type.

14 Claims, 11 Drawing Sheets

HIGH SPEED CASCODE CIRCUIT WITH LOW POWER CONSUMPTION

CROSS-REFERENCES TO RELATED APPLICATIONS

This is a continuation in part of International Application No. PCT/JP2006/340294, filed Dec. 18, 2006 which was not published in English under PCT Article 21(2).

TECHNICAL FIELD OF THE INVENTION

The present invention relates to the field of nonvolatile memory devices and more particularly to the configurations of current detecting circuits and differential amplifier circuits.

BACKGROUND OF THE INVENTION

Recently, nonvolatile memories that are data rewritable semiconductor devices have been widely used for the storage of electronic data. FIG. 1 shows the sense amp configuration of a nonvolatile semiconductor memory device disclosed in Japanese Unexamined Patent Publication No. 2002-237193. This configuration includes a detecting unit 130 disposed on the side of a memory cell (data cell), a detecting unit 132 disposed on the side of a reference cell, and a differential amplifier unit 134. If a wordline WLARY is selected and a Y gate YG101 is turned ON by a gate signal YGARY, the detecting unit 130 detects the current of a memory cell MC101 and converts the detected current into voltage. The detected data (voltage) is output from a node SENSEARY. If a wordline WLREF is selected and a Y gate YG102 is turned ON by a gate signal YGREF, the detecting unit 132 detects the current of a reference cell MC102 and converts the detected current into voltage. The detected data (voltage) is output from a node SENSEREF. Then, the output voltage of the detecting unit 130 is compared with the output voltage of the detecting unit 132 coupled to the reference cell, using the differential amplifier unit 134 to determine whether the data is "1" or "0."

However, the conventional art illustrated in FIG. 1 does not teach the correlation between the device characteristics (structures, sizes, etc.) of transistor elements in which the same current flows. For instance, neither the relationship between the characteristics of the NMOS diode M104a and the characteristics of the transistor M114 nor the relationship between the device characteristics of the NMOS diode M104b and the characteristics of the transistor M118 are disclosed. This leads to the problem that if the current ratio between the NMOS diode M104a and the transistor M114 is set to a specified ratio through an amperage adjustment made by changing the size of transistor, the circuit design suffers because the current ratio is not precisely proportional to the sizes of the transistors. Transistors that have different sizes have different current densities. This causes variations in the properties of the transistors and, as a consequence, may compromise data reading accuracy. However, the NMOS diode M104a and the transistor M114 are coupled in different ways and moreover, there is no restriction on their sizes. The same is true for the relationship between the NMOS diode M104b and the transistor M118. Generally, M104a and M104b are restricted to being the same size, with M114 and M118 being similarly restricted. Alternatively, the ratio of the sizes of M104a and M104b are restricted to being equal to the ratio of the sizes of M114 and M118. That is, the difference or ratio between the currents flowing in M104a and M104b and the difference or ratio between the currents flowing in M114 and M118 are important properties of this circuit and these two properties are independently controlled. In other words, the restriction on the amperage of M104a or M104b and the restriction on the amperage of M114 or M118 are independently given. In addition, a limit is placed on the gain of the differential amplifier circuit 134 by the output potential SENSEARY of M104a (or the output voltage SENSREF of M104b) serving as a current detecting device (Generally speaking, when the SENSEARY/SENSEREF potentials are in the vicinity of VCC, the gain decreases). Therefore, there are constraints on the design that, if not satisfied, will cause the behavior of the circuit to become unstable.

Furthermore, if the NMOS diode M104a differs from the transistor M114 in structure, current variations occur between the devices and therefore correct data reading operation cannot be performed.

In some cases, the number of detecting units 130 installed differs from the number of detecting units 132 installed. For example, there is a case where one detecting unit 130 corresponds to one differential amplifier unit 134, while one detecting unit 132 corresponds to a plurality of differential amplifier units 134. In this case, the parasitic capacitance of the signal path of the detecting unit 130 becomes smaller than the parasitic capacitance of the signal path of the detecting unit 132, causing a difference in parasitic capacitance. This causes a difference in signal transmission speed and, consequently, creates the possibility of occurrences of data readout errors. In addition, if a correction capacitance is added to the signal path of the detecting unit 130 with the view to eliminate the difference in capacitance, the correction capacitance disadvantageously brings about an increase in the size of the circuit and in current consumption.

The conventional art shown in FIG. 1 does not disclose the wiring configuration of the high potential power source VCC and low potential power source VSS. That is, the conventional art gives little insight into problems which would arise depending on the power source wiring, such as a resistance characteristics to power source noise and the need to use wide power source wiring. In addition, the conventional art of FIG. 1 does not mention the arrangement of each transistor element. That is, the conventional art does not consider problems such as increased circuit area and an unsatisfactory noise shut-off effect which are caused depending on the arrangement of the elements.

SUMMARY OF THE INVENTION

The present invention has been made to overcome the above drawbacks of the prior art and provide a nonvolatile memory device capable of: preventing variations in current and transistor properties to prevent data readout errors; facilitating design changes with a simplified adjustment of the current ratio of transistors; and increasing data reading speed.

According to an embodiment of the invention, there is provided a nonvolatile memory device comprising two current detecting circuits, a bias circuit and a differential amplifying circuit. In accordance with this embodiment, the first current detecting circuit has a first transistor of a first conductive type coupled in a diode configuration. In the first transistor, a current corresponding to the reference cell flows, thereby carrying out current-voltage conversion. The second current detecting circuit has a second transistor of the first conductive type coupled in a diode configuration. In the second transistor, a current corresponding to a memory cell flows, thereby carrying out current-voltage conversion. The bias circuit has a third transistor of the first conductive type coupled to the first transistor by a current mirror configuration. In the third transistor, a current corresponding to a voltage output from the first transistor flows. The differential amplifier circuit has a fourth transistor of the first conductive type coupled to the second transistor by a current mirror configuration. In the fourth transistor, a current corresponding to a voltage output from the second transistor flows. The differential amplifier circuit outputs a signal indicative of the difference between the currents flowing in the third and fourth transistors. The first to fourth transistors are each comprised of at least one or more unit transistor elements coupled in parallel.

The first to fourth transistors are each comprised of at least one or more unit transistor elements coupled in parallel. Herein, the unit transistor element is a first conductive type transistor of a specified size. Therefore, when setting the current ratio between the first transistor and the third transistor coupled by a current mirror configuration or the current ratio between the second transistor and the fourth transistor to a specified ratio for instance, the current ratio can be determined based on the number of transistor elements. Since the current ratios of these transistors are precisely proportional to the number of unit transistor elements, variations in the currents of the transistors can be prevented. As a result, accurate data reading becomes possible.

Furthermore, since the current ratio is determined by the number of unit transistor elements, the current density of the unit transistor elements should be invariably constant. Therefore, the properties of the transistors dependent on the current density can be prevented from varying. As a result, accurate data reading becomes possible.

There sometimes arises a situation in which the current of a device needs to be changed according to required properties, such as when the current is increased for high speed operation or when the current is reduced for low power consumption. In such a situation, the current ratio can be adjusted by changing the number of unit transistor elements, thus, design changes can be accomplished with less difficulty relative to when the current ratio is adjusted by changing the size of a transistor.

According to another embodiment of the invention, there is also provided a nonvolatile memory device comprising two current detecting circuits, two bias circuits and two differential amplifying circuits. According to this embodiment, the first current detecting circuit outputs a reference voltage according to the current flowing in the reference cell. The second current detecting circuit outputs the current flowing in the selected memory cell as a memory cell voltage. The first bias circuit inputs the reference voltage so that a current corresponding to the reference cell flows in the first bias circuit. The first differential amplifier circuit inputs the memory cell voltage and is coupled to the first bias circuit by a current mirror configuration, so that it outputs a signal corresponding to the difference between the current flowing in the first bias circuit and the current corresponding to the memory cell voltage. The second bias circuit is coupled to the first bias circuit by a current mirror configuration. The second differential amplifier circuit, which inputs the signal output from the first differential amplifier circuit and is coupled to the second bias circuit by a current mirror configuration, outputs a signal in accordance with the signal output from the first differential amplifier circuit and the signal output from the second bias circuit.

With the provision of the first and second bias circuits, a current read out from the reference cell can be supplied with sufficient driving power, so that the circuit configuration can be simplified and the reading speed can be increased.

Accordingly, the invention makes it possible to provide a nonvolatile memory device capable of: preventing variations in the current and transistor properties to prevent data readout errors; facilitating design changes with a simplified adjustment of the current ratio of transistors; and achieving increased data reading speed.

DETAILED DESCRIPTION OF THE DRAWINGS

Reference will now be made in detail to various embodiments in accordance with the invention, examples of which are illustrated in the accompanying drawings. While the invention will be described in conjunction with various embodiments, it will be understood that these various embodiments are not intended to limit the invention to these embodiments. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 1:
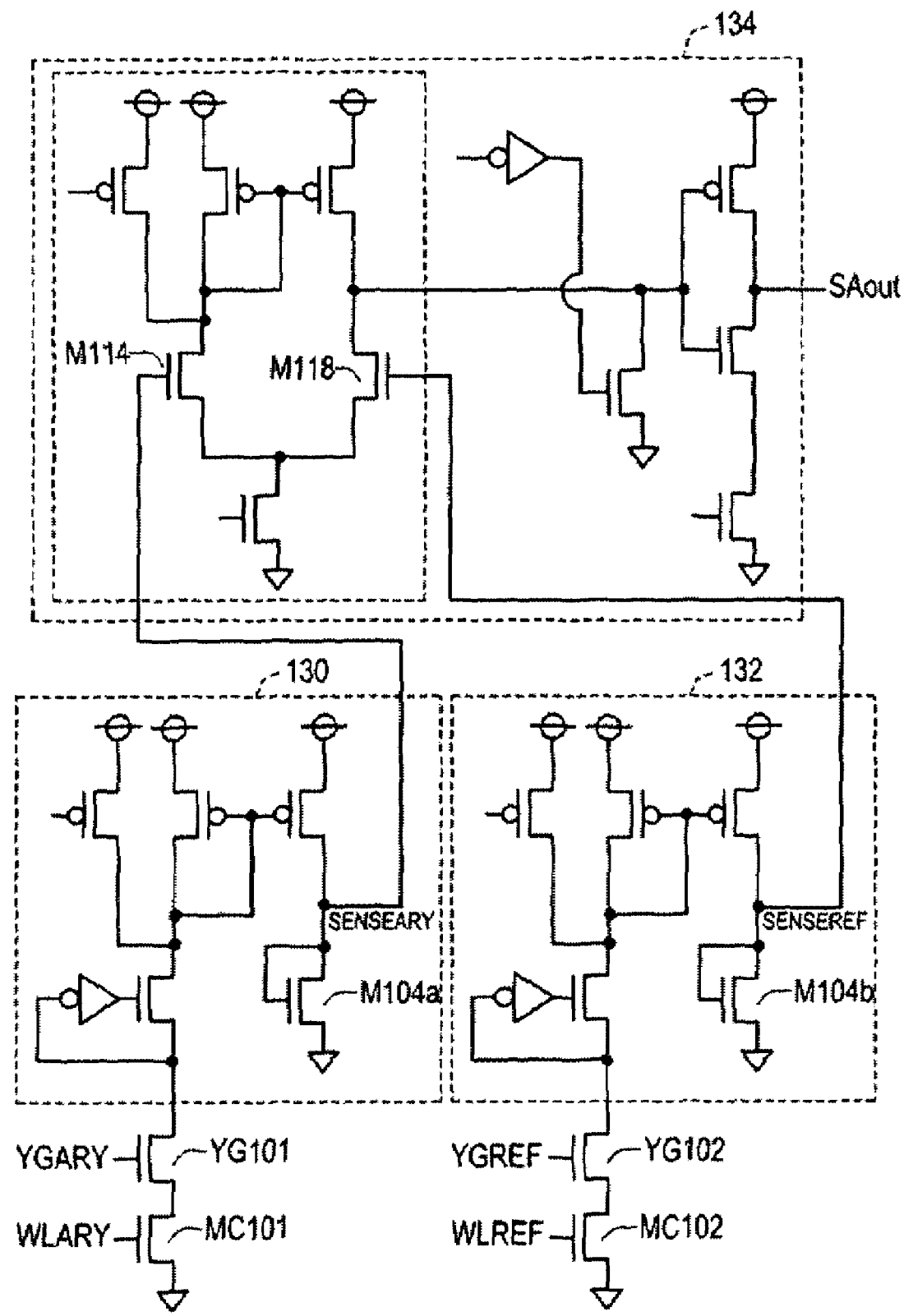
[FIG. 1] shows a sense amp configuration of a nonvolatile semiconductor memory device in accordance with an embodiment of the invention.
Figure 2:
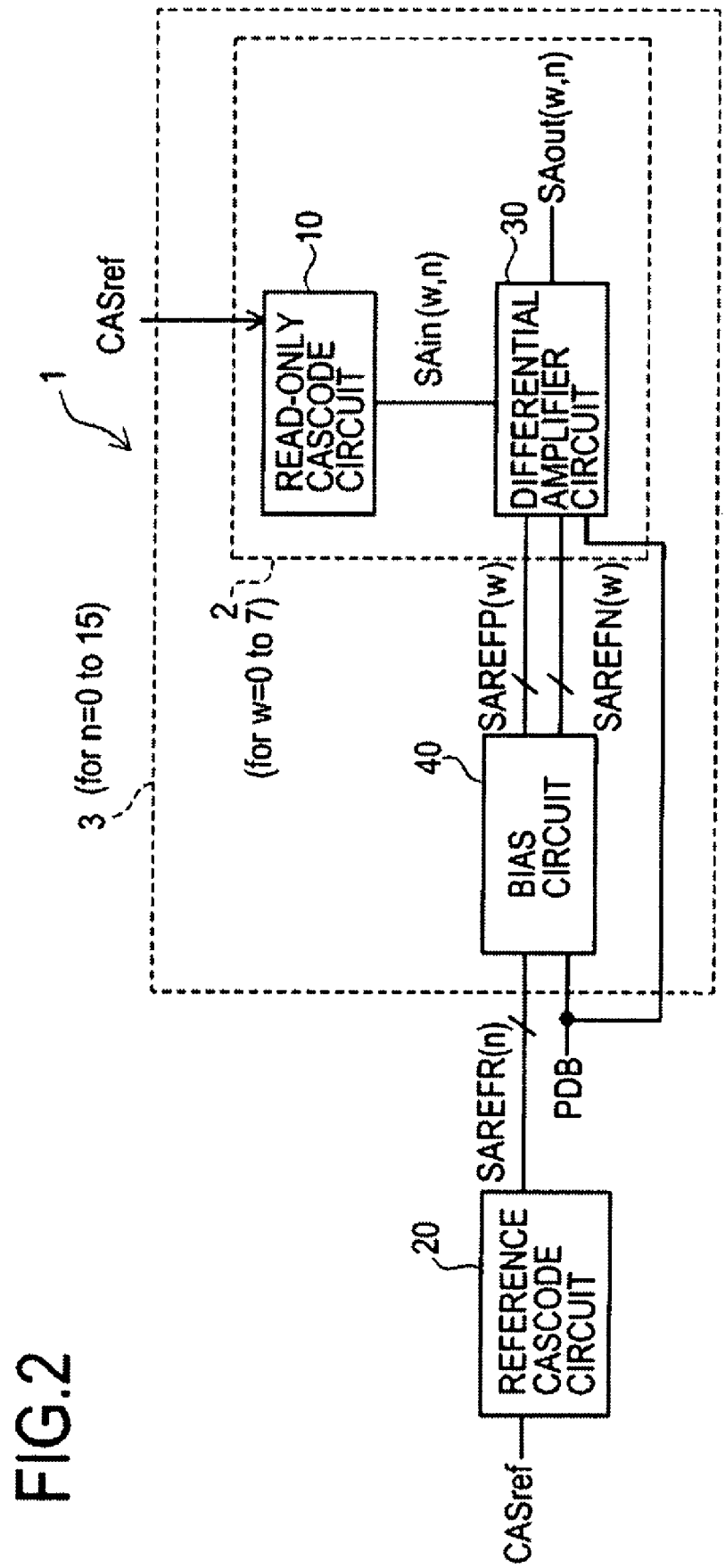
[FIG. 2] shows a circuit configuration of a read-only cascode circuit in accordance with an embodiment of the invention.

Referring now to FIGS. 2 to 7 of the accompanying drawings, the nonvolatile semiconductor memory device of the invention will be described in detail according to preferred embodiments. A first embodiment will be described. FIG. 2 shows a sense amp configuration of a nonvolatile semiconductor memory device 1. The semiconductor memory device 1 has read-only cascode circuits 10, a reference cascode circuit 20, differential amplifier circuits 30 and bias circuits 40.

The semiconductor memory device 1 has 16 I/O units 3. Eight readout units 2 are provided for each I/O unit 3. Specifically, one reference cascode circuit 20, 16 I/O units 3, and 128 readout units 2 are provided. Each of the 16 I/O units 3 is designed to simultaneously read eight pieces of data, so that data of 128 memory cells are read out at a time.

The reference cascode circuit 20 inputs a reference voltage CASref. The reference cascode circuit 20 outputs a reference voltage SAREFR (n) (n=0 to 15) to the bias circuits 40 of the I/O units 3. The bias circuits 40 output reference potentials SAREFP (w) (w=0 to 7) and SAREFN (w) to the differential amplifier circuits 30 provided in the readout units 2.

128 differential amplifier circuits 30 and 128 read-only cascode circuits 10 are provided. The read-only cascode circuits 10 input the reference voltage CASref. A readout voltage SAin (w, n) output from the read-only cascode circuits 10 enters the differential amplifier circuits 30. The differential amplifier circuits 30 output an output voltage SAout (w, n). The bias circuits 40 and the differential amplifier circuits 30 input an activation signal PDB.

Figure 3:
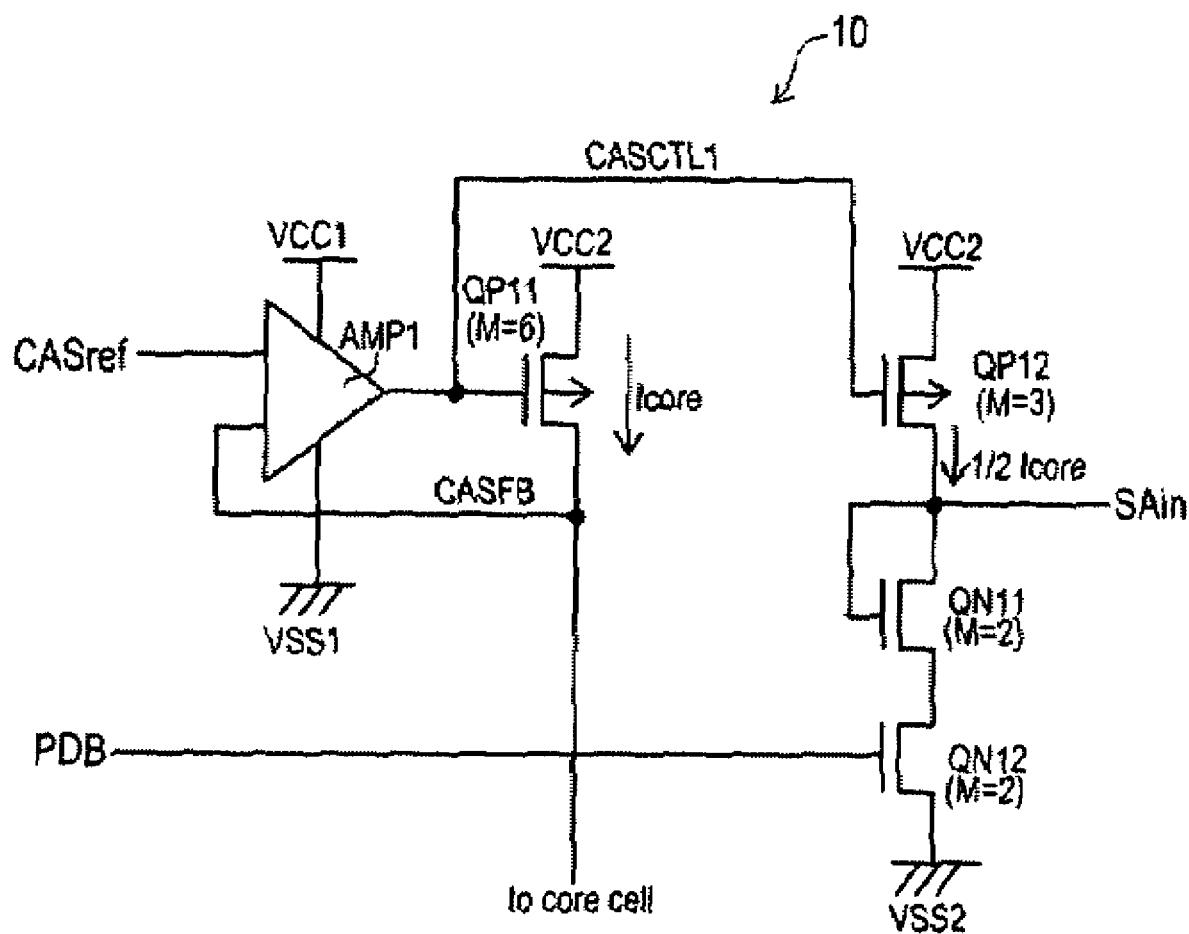
[FIG. 3] shows a circuit configuration of a reference cascode circuit in accordance with an embodiment of the invention.

FIG. 3 shows the circuit configuration of each read-only cascode circuit 10 for reading data stored in a memory cell. The read-only cascode circuits 10 each have an operational amplifier AMP1, PMOS transistors QP11, QP12, and NMOS transistors QN11, QN12. The source terminal of the PMOS transistor QP11 is coupled to a second high potential power source VCC2, its drain terminal is coupled to a core cell (not shown) and the operational amplifier AMP1, and its gate terminal is coupled to the output terminal of the operational amplifier AMP1. The source terminal of the PMOS transistor QP12 is coupled to the second high potential power source VCC2, its drain terminal is coupled to the drain terminal of the NMOS transistor QN11, and its gate terminal is coupled to the output terminal of the operational amplifier AMP1. The source terminal of the NMOS transistor QN11 is coupled to the drain terminal of the NMOS transistor QN12, and its gate terminal is coupled to the drain terminal. The source terminal of the NMOS transistor QN12 is coupled to a second low potential power source VSS2 and its gate terminal inputs the activation signal PDB. The operational amplifier AMP1 inputs the reference voltage CASref and a feedback voltage CASFB. The operational amplifier AMP1 is supplied with a first high potential power source VCC1 and a first low potential power source VSS1. The operational amplifier AMP1 outputs a control signal CASCTL1. The drain of the NMOS transistor QN11 outputs a readout voltage SAin.

Figure 4:
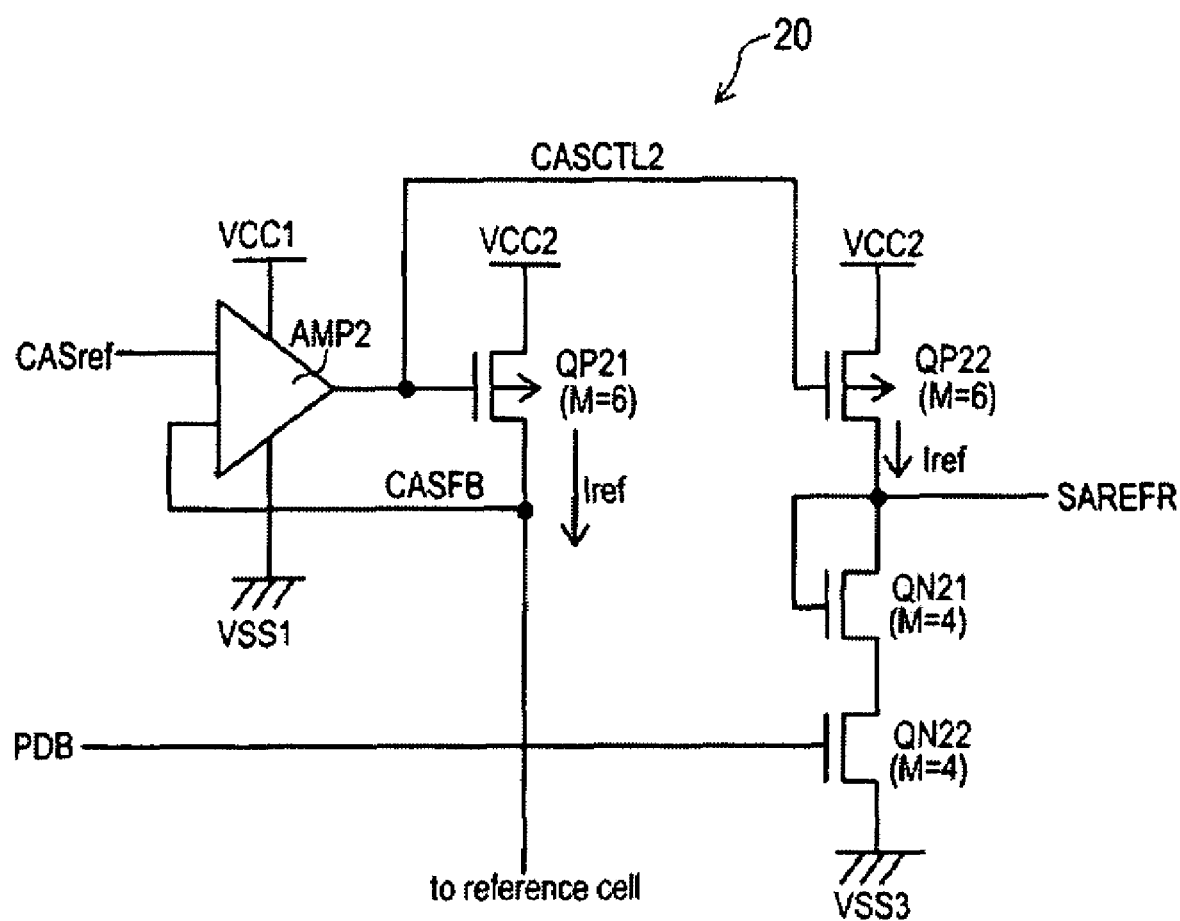
[FIG. 4] shows a circuit configuration of a differential amplifier circuit and a bias circuit in accordance with an embodiment of the invention.

FIG. 4 shows the circuit configuration of the reference cascode circuit 20 for reading data out from the reference cell. The reference cascode circuit 20 has an operational amplifier AMP2, PMOS transistors QP21, QP22, and NMOS transistors QN21, QN22. The drain of the NMOS transistor QN21 outputs the reference voltage SAREFR. Otherwise, the configuration of the reference cascode circuit 20 does not differ from that of the read-only cascode circuits 10.

Figure 5:
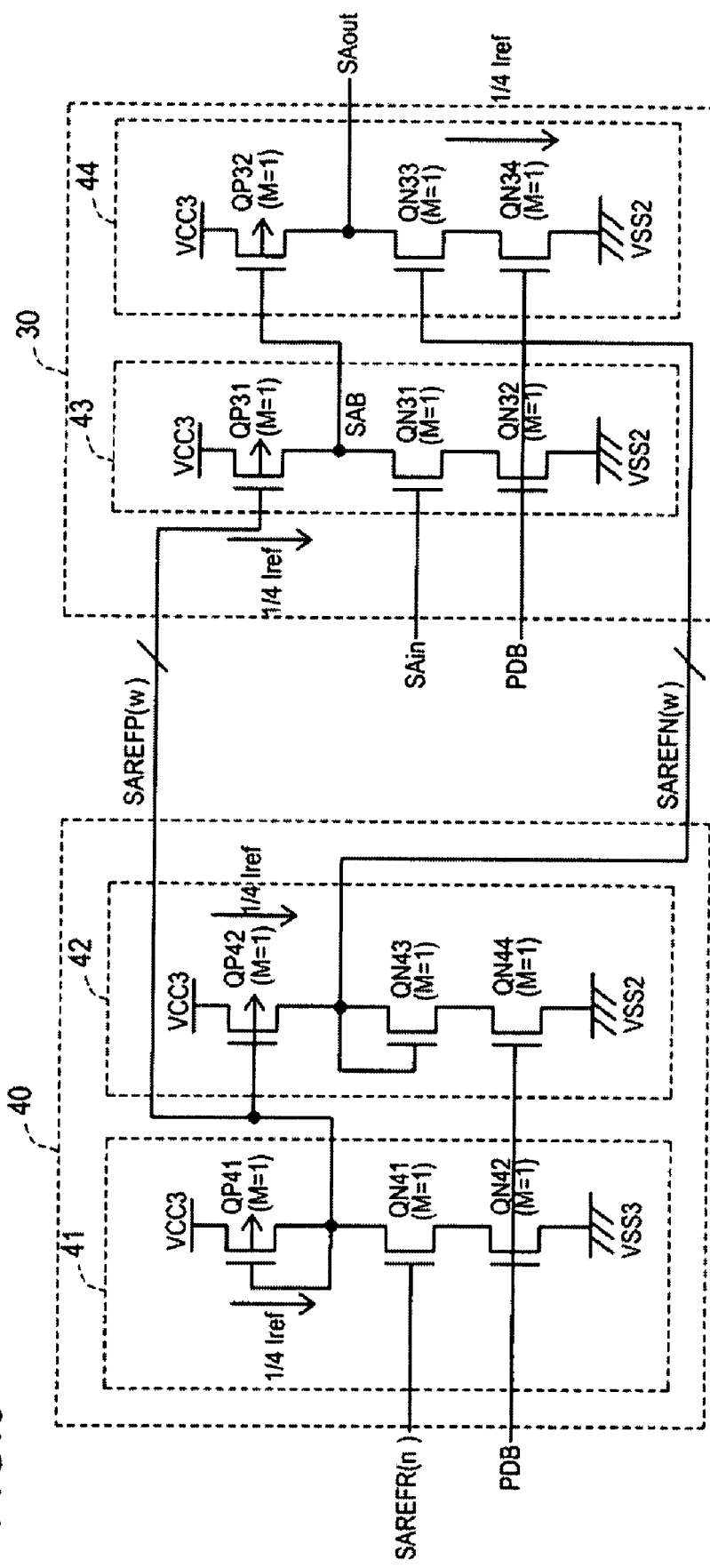
[FIG. 5] shows one pattern example of actual power source wiring lines in a semiconductor memory device in accordance with an embodiment of the invention.

FIG. 5 shows the circuit configuration of differential amplifier circuit 30 and bias circuit 40. The bias circuit 40 inputs the reference voltage SAREFR (n) output from the reference cascode circuit 20. Herein, n is 0 to 15, and 16 bias circuits 40 are provided for every reference cascode circuit 20. The bias circuit 40 outputs reference potentials SAREFP (w) and SAREFN (w) to the differential amplifier circuits 30. Herein, w is 0 to 7, and eight differential amplifier circuits 30 are provided for every bias circuit 40.

The bias circuit 40 has circuits 41, 42. The circuit 41 is configured such that a PMOS transistor QP41 and NMOS transistors QN41, QN42 are coupled in series between a third high potential power source VCC3 and a third low potential power source VSS3. The gate terminal of the PMOS transistor QP41 is coupled to the drain terminal, thereby forming a diode connection. The gate of the NMOS transistor QN41 inputs the reference voltage SAREFR (n). The NMOS transistor QN41 is coupled to the NMOS transistor QN21 of the reference cascode circuit 20 by a current mirror configuration. The gate of the NMOS transistor QN42 inputs the activation signal PDB.

The circuit 42 is configured such that a PMOS transistor QP42 and NMOS transistors QN43, QN44 are coupled in series between the third high potential power source VCC3 and the second low potential power source VSS2. The gate terminal of the NMOS transistor QN43 is coupled to the drain terminal, thereby forming a diode connection. The PMOS transistor QP42 is coupled to the PMOS transistor QP41 by a current mirror configuration. The gate of the NMOS transistor QN44 inputs the activation signal PDB.

The differential amplifier circuits 30 input the readout voltage SAin output from each of the read-only cascode circuits 10. The differential amplifier circuits 30 input the reference potentials SAREFP (w) and SAREFN (w) output from their corresponding bias circuits 40. Each differential amplifier circuit 30 has circuits 43, 44. The circuit 43 is configured such that a PMOS transistor QP31 and NMOS transistors QN31, QN32 are coupled in series between the third high potential power source VCC3 and the second low potential power source VSS2. The PMOS transistor QP31 is coupled to the PMOS transistor QP41 by a current mirror configuration. The drain of the PMOS transistor QP31 outputs an output voltage SAB. The gate of the NMOS transistor QN31 inputs the readout voltage SAin. The gate of the NMOS transistor QN32 inputs the activation signal PDB.

The circuit 44 is configured such that a PMOS transistor QP32 and NMOS transistors QN33, QN34 are coupled in series between the third high potential power source VCC3 and the second low potential power source VSS2. The NMOS transistor QN33 is coupled to the NMOS transistor QN43 in a current mirror connection. The gate of the PMOS transistor QP32 inputs the output voltage SAB and its drain outputs an output voltage SAout. The gate of the NMOS transistor QN34 inputs the activation signal PDB.

Herein, the circuits 41, 42, 43 and 44 serve examples of the first bias circuit, second bias circuit, first differential amplifier circuit and second differential amplifier circuit, respectively, of the present invention.

An M factor is now explained. In this embodiment, the transistors provided in the read-only cascode circuits 10, the reference cascode circuit 20, the differential amplifier circuits 30 and the bias circuits 40 are each configured such that at least one or more unit transistor elements having the same size are coupled in parallel. Herein, the number of unit transistor elements arranged is defined as the "M factor." Regarding the read-only cascode circuits 10 (FIG. 3), the M factor of the PMOS transistor QP11 is 6 (M=6), the M factor of the PMOS transistor QP12 is 3 (M=3), and the M factors of the NMOS transistors QN11, QN12 are 2 (M=2). Regarding the reference cascode circuit 20 (FIG. 4), the M factors of the PMOS transistors QP21, QP22 are 6 (M=6), whereas the M factors of the NMOS transistors QN21, QN22 are both 4 (M=4). As understood from above, the M factor of the PMOS transistor QP22 (M=6) of the reference cascode circuit 20 is twice that of the PMOS transistor QP 12 (M=3) of the read-only cascode circuits 10 and therefore the current supply capacity of the former is twice that of the latter. In FIG. 5, the M factors of the NMOS transistors QN41 to QN44, PMOS transistors QP41, QP42, which are provided in each bias circuit 40, are all 1 (M=1). The M factors of the NMOS transistors QN31 to QN34 and PMOS transistors QP31, QP32, which are provided in each differential amplifier circuit 30, are all 1 (M=1).

The operation of the read-only cascode circuits 10 and the reference cascode circuit 20 is now described. Subsequent to a start of the operation of the semiconductor memory device 1, the activation signal PDB goes to a high level and the read-only cascode circuits 10, the reference cascode circuit 20, the differential amplifier circuits 30 and the bias circuits 40 are all activated.

The operation of each read-only cascode circuit 10 is now described. The operational amplifier AMP1 applies the control signal CASCTL1 to the gate terminals of the PMOS transistors QP11, QP12 to make the feedback voltage CASFB equal to the reference voltage CASref. Since this causes the bit line potential to be kept at a constant value when reading data from a memory cell, excessive stress on the circuit can be avoided so that a normal readout operation can be performed.

At that time, a current Icore corresponding to "1" or "0" stored in the memory cell flows into the PMOS transistor QP11. Since the M factor ratio between the PMOS transistor QP11 (M=6) and the PMOS transistor QP12 (M=3) is 2:1, a current Icore/2 flows in the PMOS transistor QP12. In the NMOS transistor QN11 coupled in a diode configuration, a current/voltage conversion is made to output a readout voltage SAin corresponding to the current Icore/2.

The operation of the reference cascode circuit 20 is now described. The operational amplifier AMP2 applies a control signal CASCTL2 to the gate terminals of the PMOS transistors QP21, QP22 to make the feedback voltage CASFB equal to the reference voltage CASref. At that time, a current Iref dependent on the reference cell flows in the PMOS transistor QP21. Since the M factor ratio between the PMOS transistor QP21 (M=6) and the PMOS transistor QP22 (M=6) is 1:1, the current flowing in the PMOS transistor QP12 is also the current Iref. In the NMOS transistor QN21 coupled in a diode configuration, a current/voltage conversion is made, so that the reference voltage SAREFR corresponding to the current Iref is output.

The functions of the differential amplifier circuits 30 and the bias circuits 40 are now described. In the differential amplifier circuits 30 and the bias circuits 40, the readout voltage SAin output from the read-only cascode circuits 10 is compared to the reference voltage SAREFR output from the reference cascode circuit 20, thereby determining whether the data written in the memory cell is "1" or "0." Each bias circuit 40 functions to supply the reference potentials SAREFP and SAREFN to eight differential amplifier circuits 30.

The operation of the circuits 41, 43 will be described. These circuits constitute a first stage differential amplifier for amplifying the difference between the currents Icore and Iref. The activation signal PDB firstly transitions to a high level and the differential amplifier circuits 30 and the bias circuit 40 are brought into their operating state. Since the M factor ratio between the NMOS transistor QN21 (M=4) in the reference cascode circuit 20 and the NMOS transistor QN41 (M=1) in the circuit 41 is 4:1, a current Icore/4 flows in the NMOS transistor QN41. The current Icore/4 is converted into a voltage from a current by the PMOS transistor QP41 coupled in a diode configuration and output as the reference potential SAREFP(w) to each of the differential amplifier circuits 30.

The reference potential SAREFP(w) is applied to the gate of the PMOS transistor QP31 of the circuit 43. Since the PMOS transistor QP41 (M=1) is coupled to the PMOS transistor QP31 (M=1) by a current mirror configuration and they have the same M factor (M=1), a current Iref/4 flows in the PMOS transistor QP31. The readout voltage SAin is applied to the gate of the NMOS transistor QN31 and a current corresponding to the readout voltage SAin flows therein. In the circuit 43, the difference between the current corresponding to the readout voltage SAin and the current corresponding to the reference voltage SAREFR is obtained and amplified through differential amplification to be output as the output voltage SAB. The output voltage SAB drops as SAin rises and rises as SAin drops.

The operation of the circuits 42, 44 will be explained. They constitute a differential amplifier for further increasing the gain of the differential amplifier circuits 30 by further amplifying the output voltage SAB. Since the M factor ratio between the PMOS transistor QP41 (M=1) and the PMOS transistor QP42 (M=1) is 1:1, the current Iref/4 flows in the PMOS transistor QP42. Then, the NMOS transistor QN43 coupled in a diode configuration outputs a reference potential SAREFN (w) corresponding to the current Iref/4 to each of the differential amplifier circuits 30.

The reference potential SAREFN (w) is applied to the gate of the NMOS transistor QN33 of the circuit 44. Since the NMOS transistor QN43 (M=1) is coupled to the NMOS transistor QN33 (M=1) by a current mirror configuration and they have the same M factor (M=1), the current Iref/4 flows in the NMOS transistor QN33. The output voltage SAB is applied to the gate of the PMOS transistor QP32. Therefore, in the circuit 44, the difference between the current corresponding to the output voltage SAB and the current corresponding to the reference voltage SAREFR is obtained and amplified through differential amplification to be output as the voltage SAout.

Thus, differential amplification is performed by the differential amplifier circuits 30 and the bias circuits 40. As the readout voltage SAin rises, the output voltage SAB drops and the output voltage SAout rises. On the other hand, as the readout voltage SAin drops, the output voltage SAB rises and the output voltage SAout drops. The output voltage SAout enters a decoder circuit (not shown) and it is then determined whether the data stored in the memory cell is "1" or "0."

The effect of the M factor is now explained. When setting the current ratio between the NMOS transistors QN21 and QN41 through transistor size alteration to 4:1, for example, it is necessary to design the circuit in consideration of the variations in the properties due to transistor size, because the current ratio is not precisely proportional to transistor size. This can cause problems, such as causing variations to occur in the currents of the transistors or complicating the design of the circuit. In contrast, the NMOS transistors QN21, QN41 of the invention are respectively constituted by parallel-coupled, n-type unit transistor elements having the same size and the same device structure, and the ratio between the number of n-type unit transistor elements constituting QN21 to the number of n-type unit elements constituting QN41 is 4:1. Since the current ratio is precisely proportional to the number of N-type unit transistor elements, the current ratio between the NMOS transistors QN21 and QN41 can be exactly set to 4:1. Therefore, variations in the currents of the transistors can be prevented.

In the first embodiment, the transistors provided in the read-only cascode circuits 10, the reference cascode circuit 20, the differential amplifier circuits 30 and the bias circuits 40 are each constructed by coupling at least one or more n-type unit transistor elements and p-type unit transistor elements in parallel. This makes it possible to adjust the current ratio by changing the number of unit transistor elements in cases there arises a need for alteration of the current of each transistor according to required properties, such as when the current is increased to perform high speed operation or when the current is decreased for low power consumption. As a result, changes in design can be accomplished with significantly less difficulty.

In addition, since the current ratio is dependent on the number of unit transistor elements, the current density of the unit transistor elements is invariably constant. Therefore, it becomes possible to avoid such unfavorable situations in which the properties of the transistors vary depending on the current density. Consequently, accurate data reading operation can be performed.

The effect of the bias circuits 40 will be explained. If the bias circuits 40 are not provided, 128 differential amplifier circuits are coupled to one reference cascode circuit 20 and 128 read-only cascode circuits 10 are coupled to 128 differential amplifier circuits 30. In this case, the ratio between the parasitic capacitance of the output path of the readout voltage SAin output from the read-only cascode circuits 10 and the parasitic capacitance of the output path of the reference voltage SAREFR output from the reference cascode circuit 20 is as great as 1:128. Therefore, a difference in signal transmission speed occurs, causing a readout error. Another problem is such that if a correction capacitance is added to the output path of the read-only cascode circuits 10 to reduce the signal transmission speed difference, the reading speed will decrease.

In the first embodiment, there are provided 16 bias circuits 40 to which one reference cascode circuit 20 is coupled (see FIG. 2). This makes it possible to reduce the ratio between the parasitic capacitance of the output path of the read-only cascode circuits 10 and the parasitic capacitance of the output path of the reference cascode circuit 20 to 1:16. Therefore, there is no need to add a correction capacitance to the output path of the read-only cascode circuits 10. Thereby, when driving a large number of differential amplifier circuits 30 from one reference cascode circuit 20, the data reading speed can be increased. The first embodiment has been described where 16 I/O units 3 each having eight readout units 2 are provided. Herein, the bias circuits 40 belong to the I/O units and correspond to eight readout units incorporated in each I/O unit. This is one example of the optimum arrangements. Of course, there are other examples of the optimum arrangements. The eight readout units belonging to each I/O unit are selected by a 3-bit address. This is generally called a "page address" and the bias circuits 40 may correspond to 0 to 7 page addresses, respectively. Specifically, this can be effectuated by replacing the I/O units 3 with page units (n=0 to 7) and the readout units 2 with I/O units (w=0 to 15) in FIG. 2.

The M factor of the PMOS transistor QP22 (M=6) of the reference cascode circuit 20 is set twice as large as that of the PMOS transistors QP12 (M=3) of the read-only cascode circuits 10. As such, since the current ratio is proportional to the number of transistors, the current supply capacity of the reference cascode circuits 20 can be set twice as large as that of the read-only cascode circuits 10. Therefore, the signal transmission speed difference between the read-only cascode circuits 10 and the reference cascode circuit 20 can be further mitigated. This also makes it possible to increase the data reading speed in cases where a number of differential amplifier circuits 30 are driven from one reference cascode circuit 20.

According to the semiconductor memory device 1 of the first embodiment, as was previously disclosed, each transistor is comprised of a parallel connection of a plurality of unit transistor elements having the same size and the same device structure, so that the amperage can be correctly adjusted by changing the number of unit transistor elements. As a result, variations of current in the transistors can be prevented. In addition, if a need arises to change the amperage of each transistor according to required properties, the current ratio can be adjusted by changing the number of unit transistor elements. As a result, changes in design can be accomplished with significantly less difficulty. Furthermore, since each transistor is comprised of at least one or more unit transistor elements coupled in parallel, occurrences of property variations in the transistors can be prevented. Lastly, the provision of the bias circuits 40 makes it possible to reduce the property difference due to the parasitic capacitance between the output signal paths of the read-only cascode circuits 10 and the reference cascode circuit 20. This enables an increase in the data reading speed where a number of differential amplifier circuits 30 are driven from one reference cascode circuit 20.

Figure 6:
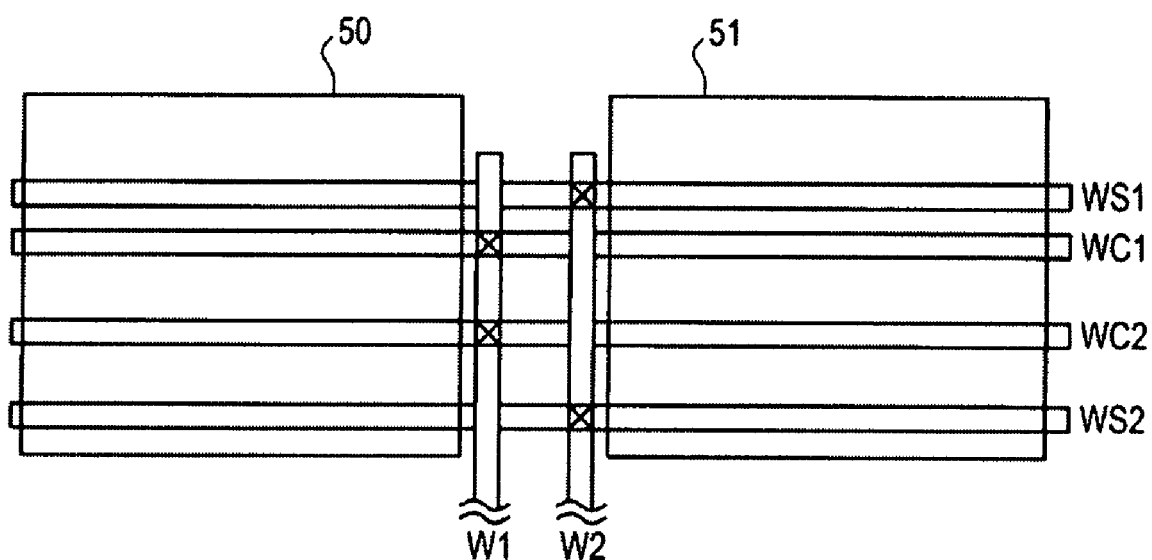
[FIG. 6] shows a device structure of the semiconductor memory device in accordance with an embodiment of the invention.

Next, reference is made to FIGS. 5, 6 to describe the second embodiment. The second embodiment is associated with the wiring configuration of the high potential power source VCC and low potential power source VSS. The semiconductor memory device 1 of the second embodiment has a basic power trunk for supplying the high potential power source VCC and a basic power trunk for supplying the low potential power source VSS. From the high basic power trunk, power source lines for three systems, i.e., first, second, third high potential power sources VCC1, VCC2, VCC3 branch off. From the low basic power trunk, power source lines for three systems, i.e., first, second, third low potential power sources VSS1, VSS2, VSS3 branch off.

As shown in FIGS. 3 and 4, the operational amplifiers AMP1 and AMP2 are supplied with the first high potential power source VCC1 and the first low potential power source VSS1. The source terminals of NMOS transistors QN11 (FIG. 3), QN31 (FIG. 5) coupled by a current mirror configuration and the source terminals of QN43, QN33 coupled by a current mirror configuration are supplied with the second low potential power source VSS2. The source terminals of the NMOS transistors QN21 (FIG. 4), QN41 (FIG. 5) coupled by a current mirror configuration are supplied with the third low potential power source VSS3. The source terminals of the PMOS transistors QP41, QP42, QP31 coupled by a current mirror configuration are supplied with the third high potential power source VCC3. In FIG. 3, the source terminals of the PMOS transistors QP11, QP12 which both input a control signal CASCTL1 are supplied with the second high potential power source VCC2. In FIG. 4, the source terminals of the PMOS transistors QP21, QP22 which both input a control signal CASCTL2 are also supplied with the second high potential power source VCC2.

Since the second high potential power source VCC2 serves as a reference for the control signals CASCTL1 and CASCTL2, it must have the same potential within one read-only cascode circuit 10 or within one reference cascode circuit 20. Since the third high potential power source VCC3 serves as a source power source for the PMOS transistors coupled by a current mirror configuration, it must have the same potential within its associated differential amplifier circuit 30 and bias circuit 40.

The first effect of the invention is now described. When designing the power source wiring of the semiconductor memory device 1, it is necessary take account of the voltage gradient of the power source wiring caused by current consumption. A great voltage gradient occurs in the power source lines coupled to the operational amplifiers AMP1, AMP2. With the configuration in which the first high potential power source VCC1 and the first low potential power source VSS1 are supplied to the operational amplifiers AMP1, AMP2, the power source wiring (to which minute voltage fluctuations are a problem) for the source power source supplied to the transistors coupled by a current mirror configuration can be arranged in a system different from that of the power source wiring for the operational amplifiers. Thereby, the power source noise resistance of the semiconductor memory device 1 can be increased.

Next, the second effect of the invention is described. In the semiconductor memory device 1, minute potential differences are amplified. Therefore, it is necessary to prevent, as much as possible, the occurrence of a potential difference between the source terminals of transistors having a corresponding relationship, such as transistors coupled by a current mirror configuration and transistors which input a common gate voltage. Since eight difference amplifier circuits 30 are coupled to one bias circuit 40, occurrence of a potential difference between the source terminals of transistors having a corresponding relationship in the differential amplifier circuits 30 should be prevented as much as possible in order to carry out accurate data reading. In light of this, a power source is shared between transistors having a corresponding relationship thereby preventing a potential difference between their source terminals even if a voltage drop occurs. As a result, the resistance to power source noise can be increased.

A third effect of the invention is now described. In cases where a circuit resistant to voltage fluctuations (such as the operational amplifiers AMP1 and AMP2) and a circuit which is not resistant to voltage fluctuations (such as the differential amplifier circuits 30) are coupled to the same power source line, a power source wiring line of low impedance and great width has been heretofore employed in order to restrict occurrence of a voltage gradient in the power source wiring line. In this embodiment, the design margin for a voltage gradient in each power source wiring line is optimized by arranging the power source wiring line coupled to the circuits having resistance to voltage fluctuations separately from the power source wiring line coupled to the circuits having no resistance to voltage fluctuations. Specifically, the widths of the power source wiring lines for supplying the first high potential power source VCC1 and the first low potential power source VSS1 to the operational amplifiers AMP1 and AMP2 which have resistance to voltage fluctuations, can be reduced. In addition, the widths of the power source wiring lines for supplying the second high potential power source VCC2, the third high potential power source VCC3, the second low potential power source VSS2 and the third low potential power source VSS3 to the circuits having no resistance to voltage fluctuations can also be reduced, because these power source wiring lines are not affected by the operational amplifiers AMP1 and AMP2, and the power consumption of the bias circuits 40 and the differential amplifier circuits 30 can be easily reduced by adjusting M factors in the cascode circuits 10 and 20. Thus, the total area occupied by the power source wiring lines can be reduced by application of the invention and more particularly by optimizing the design margin for every power source wiring line, so that the circuit scale can be reduced. The optimization of the design margin by the separation of the power sources allows for easier, more efficient power source design than that of the conventional art.

The branching method for the power source wiring lines is not limited to this. For example, in this embodiment, the second high potential power source VCC2, the third high potential power source VCC3, the second low potential power source VSS2 and the third low potential power source VSS3 are each supplied to circuits having no resistance to voltage fluctuations. Since the power consumption of the bias circuits 40 and the differential amplifier circuits 30 can be easily reduced by adjusting the M factors of the transistors in the cascode circuits 10, 20 as described earlier, it is also possible to couple the second high potential power source VCC2 and the third high potential power source VCC3 to one power source line and couple the second low potential power source VSS2 and the third low potential power source VSS3 to another one power source line.

FIG. 6 shows one pattern example of the power source wiring lines which are arranged in the semiconductor memory device 1 taking account of the above points. A wiring line W1 is a basic power trunk for supplying the high potential power source VCC and a wiring line W2 is a basic power trunk for supplying the low potential power source VSS. Circuit regions 50, 51 are provided on both sides of the wiring lines W1 and W2. In the circuit region 50, four bias circuits 40 are provided. 16 read-only cascode circuits 10 and 16 differential amplifier circuits 30 are coupled to each bias circuit 40. The circuit region 51 has the same circuit configuration as of the circuit region 50.

A wiring line WC1 for supplying the first high potential power source VCC1, a wiring line WC2 for supplying the second high potential power source VCC2, and the third high potential power source VCC3 each branch off from the wiring line W1. A wiring line WS1 for supplying the first low potential power source VSS1, a wiring line WS2 for supplying the second low potential power source VSS2, and the third low potential power source VSS3 each branch off from the wiring line W2. The wiring lines WC1, WC2, WS1, WS2 supply power to the circuit regions 50, 51. Since the wiring lines WC1, WS1 are electric wirings coupled to the operational amplifiers AMP1, AMP2 having resistance to voltage fluctuations as disclosed earlier, the wiring lines WC1, WS1 may be narrow in width. In addition, since the wiring lines WC2, WS2 are not affected by voltage fluctuations in the operational amplifiers AMP1, AMP2 as discussed earlier, the wiring lines WC2, WS2 may be narrow in width as well.

The wiring lines W1, W2, which are basic power trunks, are disposed between the circuit regions 50, 51. Therefore, the voltage gradients occurring in the wiring lines WC1, WC2, WS1, WS2 can be reduced to about half of the voltage gradients that occur in the wiring lines WC1, WC2 when they are placed at the ends of the circuit regions 50, 51.

According to the semiconductor memory device 1 of the second embodiment, the power source wiring lines susceptible to occurrences of minute voltage fluctuations can be arranged separately from the power source wiring lines unsusceptible to minute voltage fluctuations. This leads to improved resistance to power source noise. Also, a power source is shared between transistors having a corresponding relationship whereby the occurrence of a potential difference between the source terminals can be prevented even if a voltage drop occurs. This also leads to improved resistance to power source noise. Furthermore, the design margin for a voltage gradient in each power source wiring line can be optimized by the separate arrangement of the power source wiring lines coupled to the circuits having resistance to voltage fluctuations and the power source wiring lines coupled to the circuits having no resistance to voltage fluctuations. This leads to a reduction in the area occupied by the power source wiring lines and therefore a reduction in the circuit scale. The separate arrangement of the power sources and the optimization of the design margin allows for easier, more efficient power source design than that of the conventional art.

Figure 7:
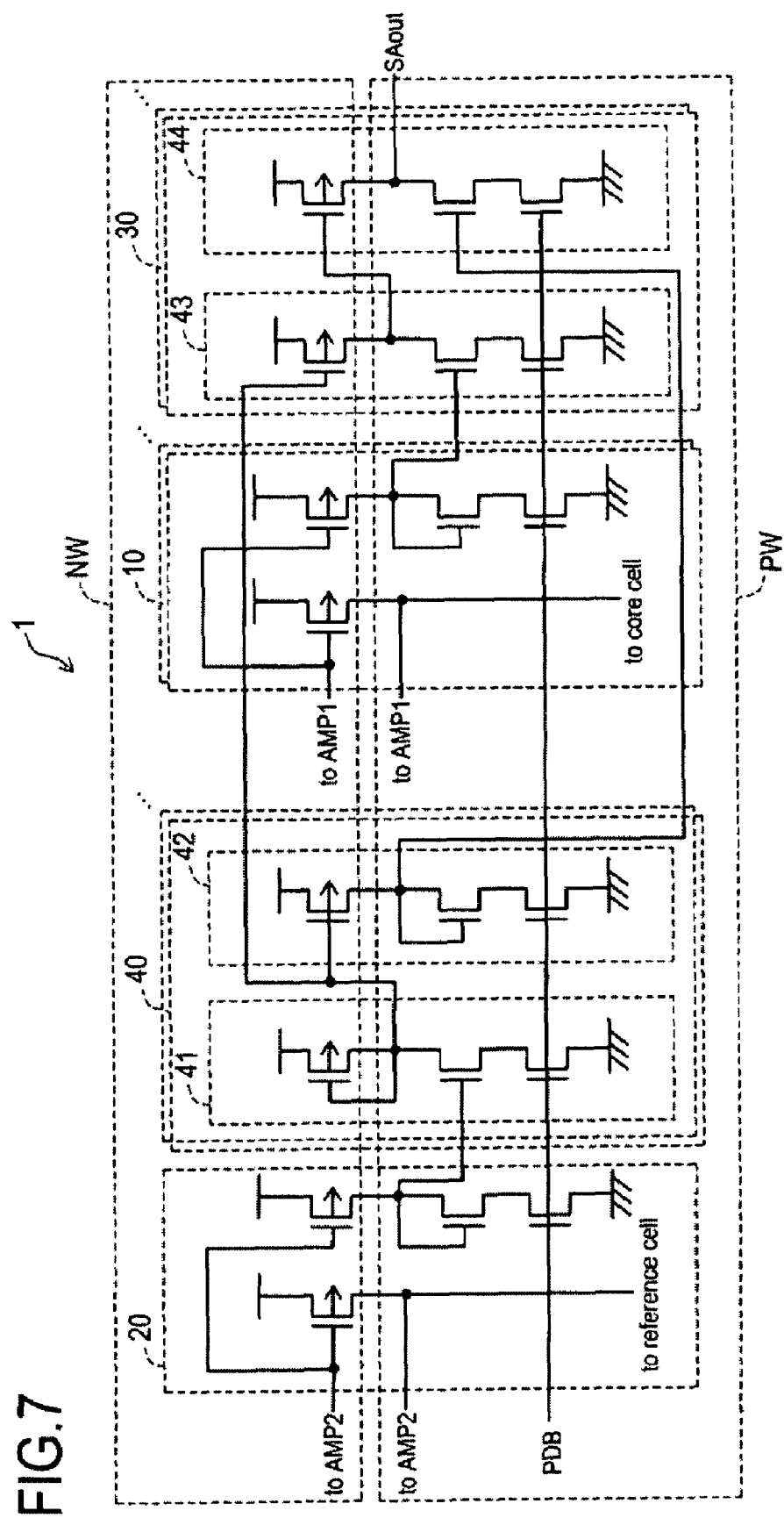
[FIG. 7] shows a circuit configuration of another cascode circuit in accordance with an embodiment of the invention.

Reference is made to FIG. 7 to describe a third embodiment. The third embodiment is associated with a device structure. The semiconductor memory device 1 has read-only cascode circuits 10, a reference cascode circuit 20, differential amplifier circuits 30 and bias circuits 40. The NMOS transistor elements of these circuits are all placed within a common Pwell region PW, whereas their PMOS transistor elements are all placed within a common Nwell region NW.

In a flush memory, minus potential is used to perform erase operations. Therefore, a triple well configuration becomes necessary when integrating a flush memory into a p-type substrate. The triple well configuration is such that the Nwell region, which completely encloses the Pwell region having the NMOS transistors therein, is provided thereby completely separating the Pwell region from the substrate. This makes it possible to obtain the effects of imparting minus potential to the NMOS transistors and shutting off noise that comes from other circuits through the substrate. If many physically-separated Pwell regions exist, the area of the Nwell regions required for well separation increases, causing an increase in circuit area.

This embodiment of the invention uses NMOS transistor elements of the same size and the same configuration for the NMOS transistor QN11 (a current load of the read-only cascode circuits 10), the NMOS transistor QN31 (an input element of the differential amplifier circuits 30), the NMOS transistor QN21 (a current load of the reference cascode circuit 20), and the NMOS transistor QN41 (an input element of the bias circuits 40). Similarly, the invention uses PMOS transistor elements of the same size and the same configuration for the PMOS transistors QP11, QP12 of the read-only cascode circuits 10; the PMOS transistors QP31, QP32 of the differential amplifier circuits 30; the PMOS transistors QP21, QP22 of the reference cascode circuit 20; and the PMOS transistors QP41, QP42 of the bias circuits 40. Thereby, the read-only cascode circuits 10, reference cascode circuit 20, differential amplifier circuits 30 and bias circuits 40 can be integrally disposed. Accordingly, all the NMOS transistor elements that flow minute electric current can be placed in the common Pwell region PW, whereas all the PMOS transistor elements that flow minute electric current can be placed in the common Nwell region NW.

The third embodiment has the following effects. First, since the number of Nwell regions NW and Pwell regions PW does not increase, the area of the circuit can be restrained from increasing. Secondly, an improved noise shut-off effect can be achieved by arranging all the NMOS transistor elements that flow minute current within the common Pwell region PW. Thirdly, since transistor elements having the same size can be used in the above-described design in which the M factor is used, the PMOS transistors of the same size can be arranged in order in the same direction in the same well and the NMOS transistors of the same size can be arranged in order in the same direction in the same well. This arrangement is expected to restrain manufacturing variations, compared to the case where the transistors have the same size but are arranged in a disorderly manner.

Generally, noise tends to occur particularly in nonvolatile memories having low voltage power sources and the SO (Simultaneous Operation) function in which bank memories simultaneously perform different functions. For instance, when a bank 1 performs erase or program operation while a bank 2 performs read operation, the bank 1 charges and discharges electrical charge by an inner high voltage of e.g., 9 (V) and the bank 2 uses a 1.8 (V) power source. Therefore, big noise is transmitted from the bank 1 to the bank 2. However, the invention provides improved noise resistance, so that noise can be shut off without fail even when it is applied to nonvolatile memories having the SO function.

Figure 8:
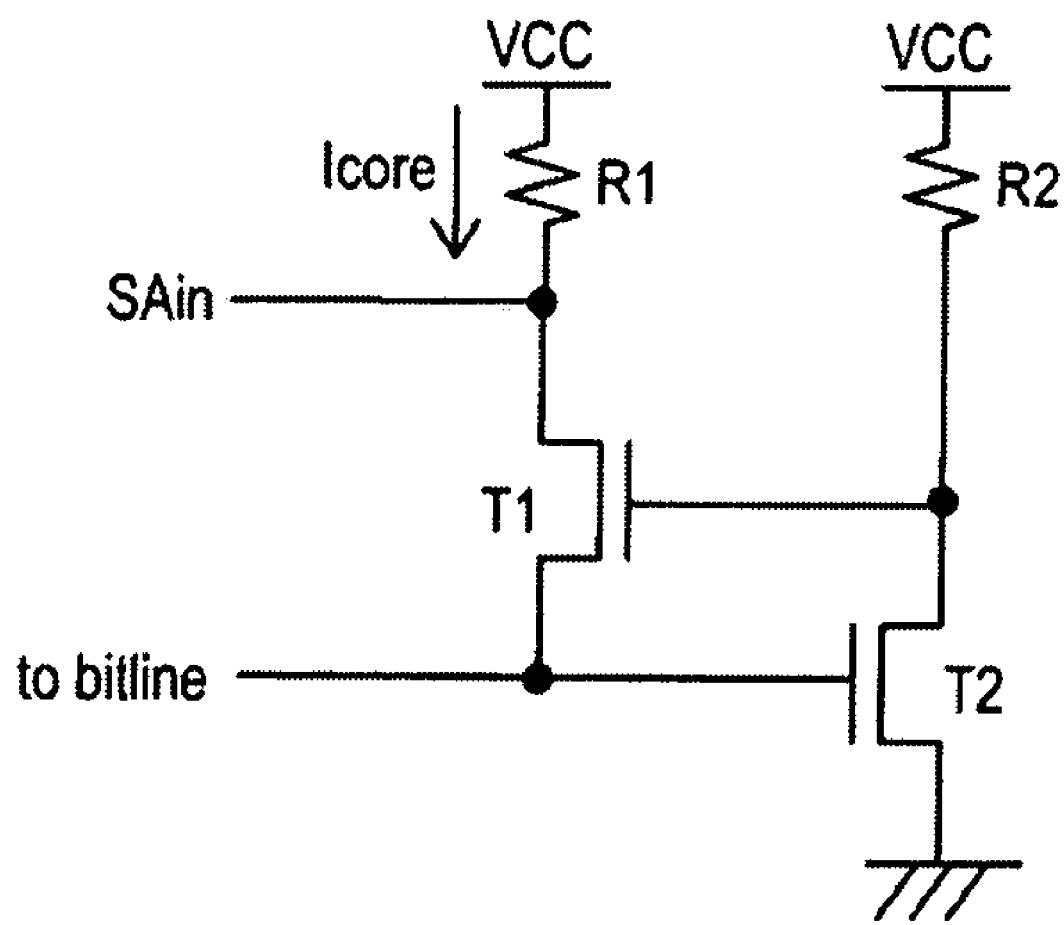
[FIG. 8] shows the sense amp configuration of a conventional nonvolatile semiconductor memory device in accordance with an embodiment of the invention.

It is apparent that the invention is not necessarily limited to the particular embodiments shown herein and various changes and modifications are made to the disclosed embodiments without departing from the spirit and scope of the invention. The read-only cascode circuits 10 and the reference cascode circuit 20 are not limited to those shown in FIGS. 3, 4. The invention is applicable, for instance, to the cascode circuit shown in FIG. 8. In this circuit, the bit line potential is determined by a circuit constant obtained from the ratio between the transistor T2 and the resistance element R2.

The arrangement of the NMOS transistors and PMOS transistors in the semiconductor memory device 1 is not limited to the one described above. It is apparent that the same operation and function can be achieved by interchanging the NMOS transistors and the PMOS transistors with each other and by interchanging the high potential power source VCC and the low potential power source VSS with each other.

The NMOS transistor QN21 serves as one example of the first transistor. The NMOS transistor QN11 serves as one example of the second transistor. The NMOS transistor QN41 serves as one example of the third transistor. The NMOS transistor QN31 serves as one example of the fourth transistor. The PMOS transistor QP41 serves as one example of the fifth transistor. The PMOS transistor QP31 serves as one example of the sixth transistor. The reference cascode circuit 20 serves as one example of the first current detecting circuit. The read-only cascode circuits 10 serve as one example of the second current detecting circuit. The low potential power source VSS serves as one example of the first potential power source. The high potential power source VCC serves as one example of the second potential power source. The third low potential power source VSS3 serves as one example of the first power source wiring. The second low potential power source VSS2 serves as one example of the second power source wiring. The third high potential power source VCC3 serves as one example of the third power source wiring. The first low potential power source VSS1 serves as one example of the fourth power source wiring. The first high potential power source VCC1 serves as one example of the fifth power source wiring.

Embodiments generally relate to nonvolatile memory devices. More particularly, embodiments allow for a nonvolatile memory device capable of: preventing variations in current and transistor properties to prevent data readout errors; facilitating design changes with a simplified adjustment of the current ratio of transistors; and achieving increased data reading speed.

In one implementation, the various embodiments are applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells," each of which traditionally stores one bit of information. However, newer flash memory devices can store more than 1 bit per cell. These newer flash memory devices double the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, newer flash memory devices have several key advantages, such as being capable of burst-mode access as fast as 80 MHz, page access times as fast as 25 ns, simultaneous read-write operation for combined code and data storage, and low standby power (e.g., 1 µA).

Figure 9:
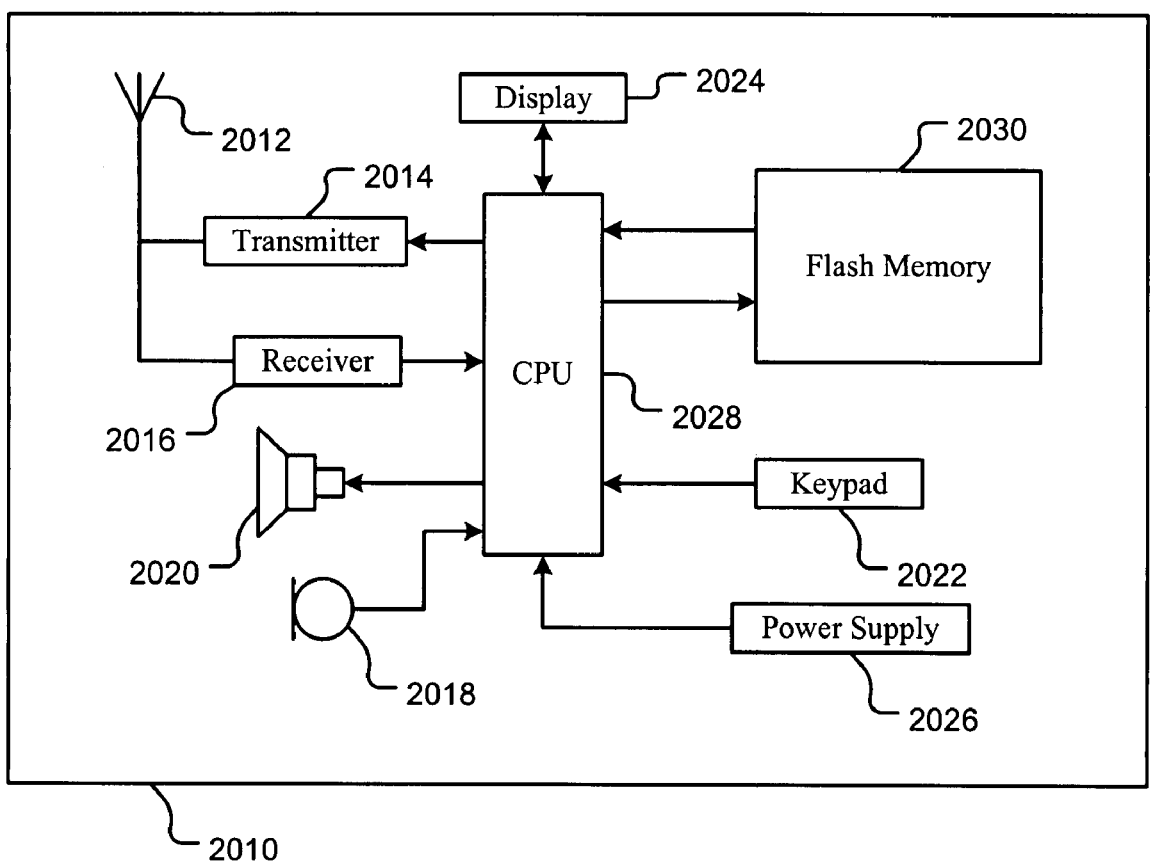
[FIG. 9] illustrates a block diagram of an exemplary portable phone, upon which various embodiments of the invention may be implemented.

FIG. 9 shows a block diagram of an exemplary portable telephone 2010 (e.g., cell phone, cellular phone, mobile phone, internet protocol phone, wireless phone, etc.), upon which various embodiments of the invention can be implemented. The cell phone 2010 includes an antenna 2012 coupled to a transmitter 2014 and a receiver 2016, as well as a microphone 2018, a speaker 2020, a keypad 2022, and a display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 can include a nonvolatile memory device capable of: preventing variations in current and transistor properties to prevent data readout errors; facilitating design changes with a simplified adjustment of the current ratio of transistors; and achieving increased data reading speed.

In various embodiments, the flash memory 2030 can be utilized with various devices, such as mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are coupled to the bit lines in a parallel configuration, while in a conventional NAND-type flash memory, the memory cell transistors are coupled to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps), flash memory requirements have steadily increased. Thus, an improved flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

It is noted that the components (e.g., 2012, 2014, 2016, 2022, 2028, 2030, etc.) of portable telephone 2010 can be coupled to each other in a wide variety of ways. For example, in an embodiment, the antenna 2012 can be coupled to transmitter 2014 and receiver 2016. Additionally, the transmitter 2014, receiver 2016, speaker 2020, microphone 2018, power supply 2026, keypad 2022, flash memory 2030 and display 2024 can each be coupled to the processor (CPU) 2028. It is pointed out that in various embodiments, the components of portable telephone 2010 can be coupled to each other via, but are not limited to, one or more communication buses, one or more data buses, one or more wireless communication technologies, one or more wired communication technologies, or any combination thereof.

Figure 10:
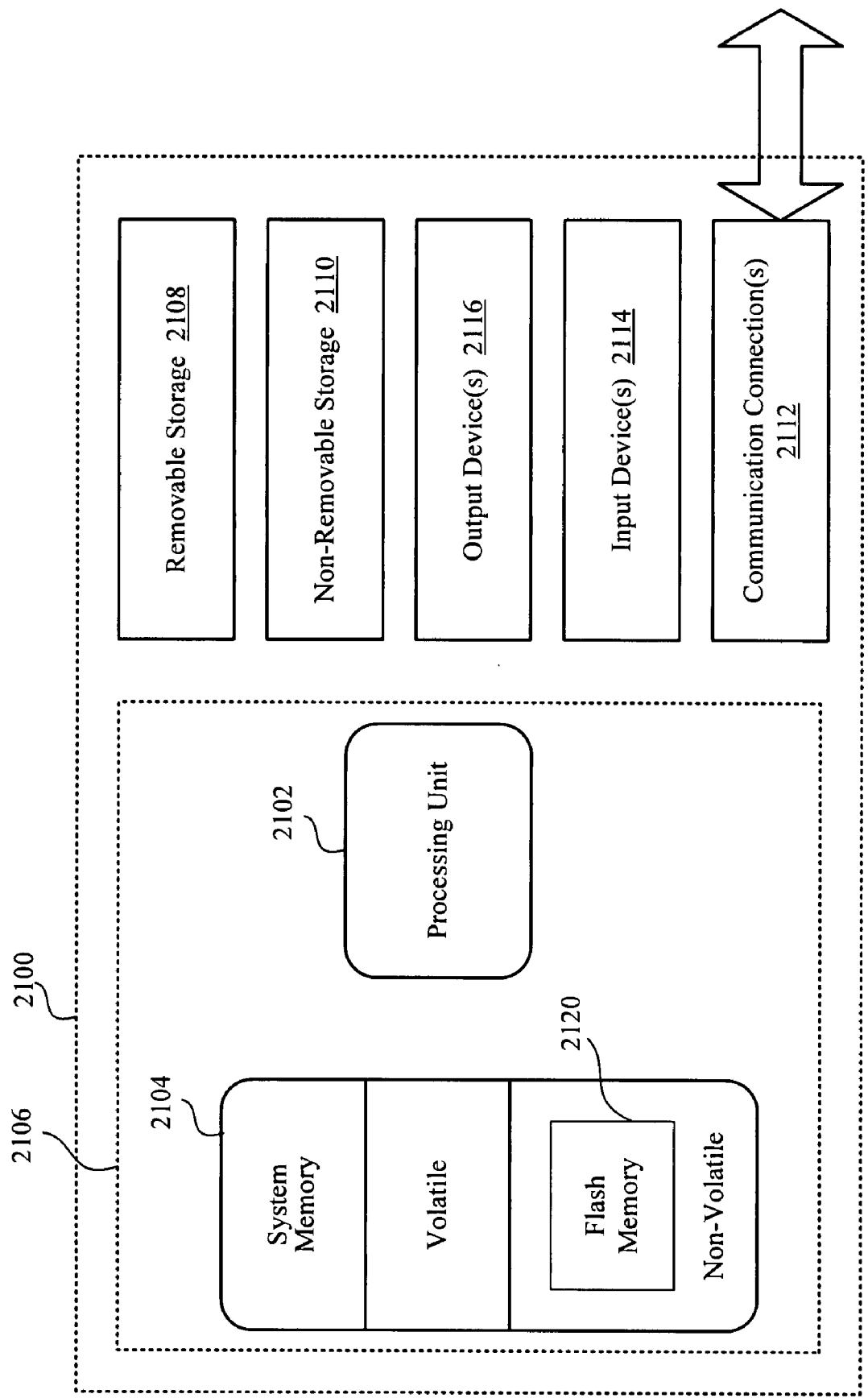
[FIG. 10] illustrates a block diagram of an exemplary computing device, upon which various embodiments of the invention may be implemented.

FIG. 10 illustrates a block diagram of an exemplary computing device 2100, upon which various embodiments of the invention can be implemented. Although computing device 2100 is shown and described in FIG. 10 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. In an embodiment, computing device 2100 can include additional components not shown in FIG. 10.

Also, it is appreciated that the computing device 2100 can be a variety of things. For example, computing device 2100 may be, but is not limited to, a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounter frequent physical impacts. Also, flash memory is more able than other types of memory to withstand intense physical pressure and/or heat. Thus, portable computing devices are able to be used in a greater range of environmental variables.

Computing device 2100 can include at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 10 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could be a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 10 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, Flash memory 2120 can include a nonvolatile memory device capable of: preventing variations in current and transistor properties to prevent data readout errors; facilitating design changes with a simplified adjustment of the current ratio of transistors; and achieving increased data reading speed.

In various embodiments, the flash memory 2120 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2120 utilizes newer flash memory technology to allow storing of two physically distinct bits on opposite sides of a memory cell.

Device 2100 may also contain communications connection(s) or coupling(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection or coupling, and wireless media such as acoustic, radio frequency (RF), infrared and other wireless media. The term computer readable media as used herein includes both storage media and communication media.

It is noted that the components (e.g., 2102, 2104, 2110, 2120, etc.) of computing device 2100 can be coupled to each other in a wide variety of ways. For example in various embodiments, the components of computing device 2100 can be coupled to each other via, but are not limited to, one or more communication buses, one or more data buses, one or more wireless communication technologies, one or more wired communication technologies, or any combination thereof.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous.

Figure 11:
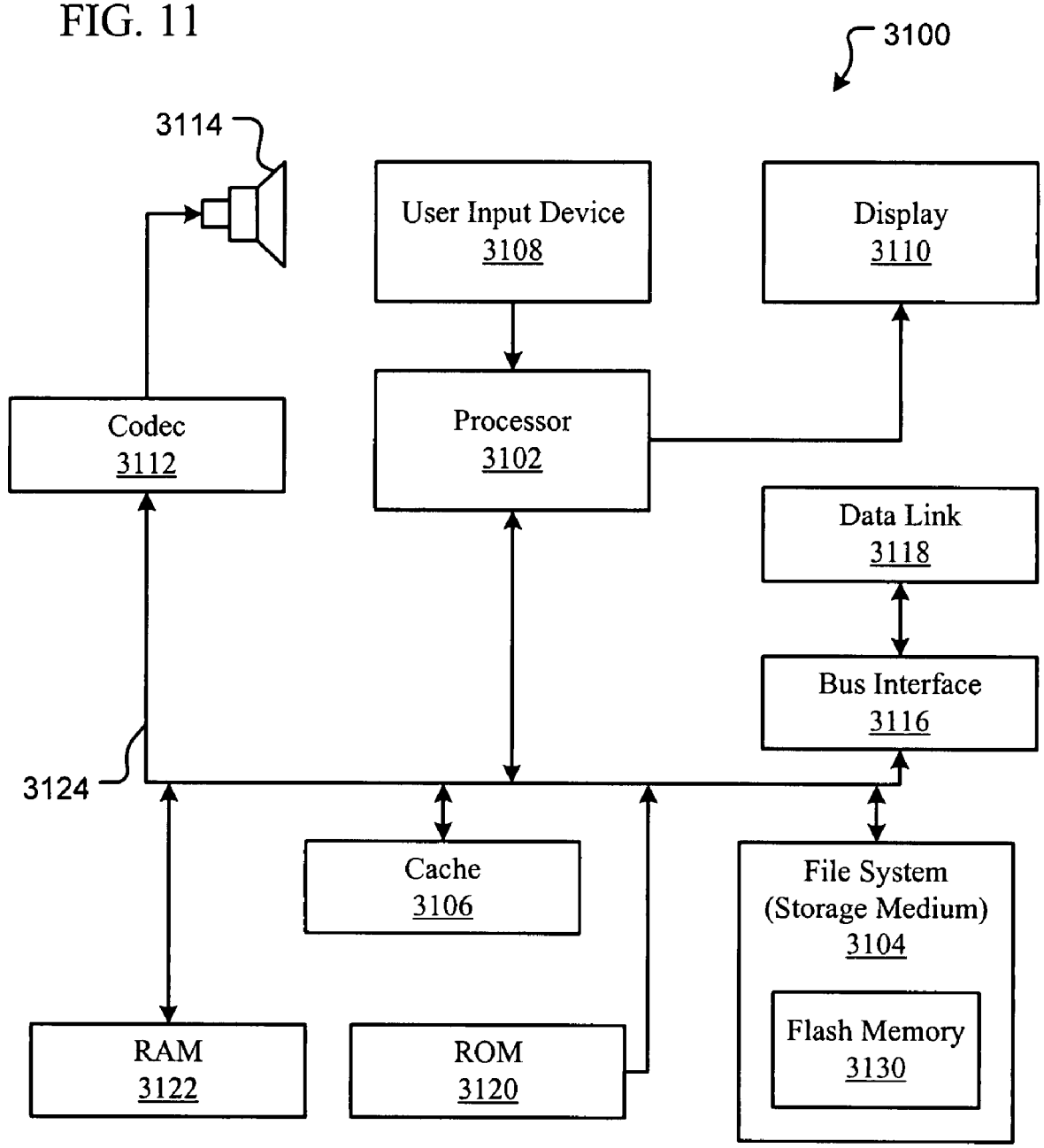
[FIG. 11] illustrates an exemplary portable multimedia device, or media player, in accordance with various embodiments of the invention.

FIG. 11 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 includes flash memory 3130. In the present embodiment, Flash memory 3130 can include a nonvolatile memory device capable of: preventing variations in current and transistor properties to prevent data readout errors; facilitating design changes with a simplified adjustment of the current ratio of transistors; and achieving increased data reading speed.

In various embodiments, the flash memory 3130 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that couple to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

It is noted that the components (e.g., 3102, 3104, 3120, 3130, etc.) of media player 3100 can be coupled to each other in a wide variety of ways. For example, in an embodiment, the codec 3122, RAM 3122, ROM 3120, cache 3106, processor 3102, storage medium 3104, and bus interface 3116 can be coupled to data bus 3124. Furthermore, the data link 3118 can be coupled to the bus interface 3116. The user input device 3108 and the display 3110 can be coupled to the processor 3102 while the speaker 3114 can be coupled to the codec 3112. It is pointed out that in various embodiments, the components of media player 3100 can be coupled to each other via, but are not limited to, one or more communication buses, one or more data buses, one or more wireless communication technologies, one or more wired communication technologies, or any combination thereof.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

What is claimed is:

1. A nonvolatile memory device comprising:
    a first current detecting circuit comprising a first transistor of a first conductive type coupled in a diode configuration, wherein current flows according to a reference cell through the first transistor;
    a second current detecting circuit comprising a second transistor of the first conductive type coupled in a diode configuration, wherein current flows according to a selected memory cell through the second transistor;
    a bias circuit comprising a third transistor of the first conductive type that is coupled to the first transistor by a current mirror configuration; and
    a differential amplifying circuit comprising a fourth transistor of the first conductive type which is coupled to the second transistor, wherein the differential amplifying circuit outputs a signal corresponding to a difference between current flowing through the third transistor and current flowing through the fourth transistor; and
    wherein the first transistor, the second transistor, the third transistor and the fourth transistor are comprised of one predetermined sized unit transistor element of the first conductive type, or are comprised of parallel couplings of predetermined sized unit transistor elements of the first conductive type.

2. The nonvolatile memory device according to claim 1, wherein:
    the bias circuit includes a fifth transistor of a second conductive type in a diode connection configuration, wherein the fifth transistor is coupled in series to the third transistor;
    the differential amplifying circuit includes a sixth transistor of the second conductive type, wherein the sixth transistor is coupled to the fifth transistor by a current mirror configuration, and wherein the sixth transistor is coupled to the fourth transistor in series;
    the fifth transistor and the sixth transistor are comprised of one predetermined sized unit transistor element of the second conductive type, or are comprised of parallel connections of a plurality of predetermined sized unit transistor elements of the second conductive type; and
    a signal is output corresponding to a difference between the current flowing through the sixth transistor and a current flowing through the fourth transistor.

3. The nonvolatile memory device according to claim 2, wherein:
    a plurality of the third transistors are coupled to the first transistor by a current mirror configuration; and
    a plurality of the sixth transistors are coupled to the fifth transistor by a current mirror configuration.

4. The nonvolatile memory device according to claim 1, further comprising:
    a first potential power source and a second potential power source supplied through a plurality of power branch lines branched from a basic power trunk, wherein the plurality of power branch lines comprise:
        a first power branch line which supplies the first potential power source to the first current detecting circuit and the bias circuit,
        a second power branch line which supplies the first potential power source to the second current detecting circuit and the differential amplifying circuit, and
        a third power branch line which supplies the second potential power source to the bias circuit and the differential amplifying circuit.

5. The nonvolatile memory device according to claim 4, further comprising:
    a source terminal of the first transistor and a source terminal of the third transistor, wherein the source terminal of the first transistor and the source terminal of the third transistor are coupled by a current mirror configuration and coupled to the first power branch line;
    a source terminal of the second transistor and a source terminal of the fourth transistor, wherein the source terminal of the second transistor and the source terminal of the fourth transistor are coupled by a current mirror configuration and coupled to the second power branch line; and a source terminal of the fifth transistor and a source terminal of the sixth transistor, wherein the source terminal of the fifth transistor and the source terminal of the sixth terminal are coupled by a current mirror configuration and coupled to the third power branch line.

6. The nonvolatile memory device according to claim 1, further comprising:

a first potential power source and a second potential power source supplied through a plurality of power branch lines branched from a basic power trunk, wherein the plurality of power branch lines comprise:

a fourth power branch line that supplies the first potential power source to a first operational amplifier, wherein the first operational amplifier is in the first current detection circuit to adjust a bias voltage on a bit line of the reference cell;

a second operational amplifier built in the second current detection circuit to adjust a bias voltage on a bit line of the memory cell; and a fifth power branch line which supplies the second power source to the first operational amplifier and the second operational amplifier.

7. The nonvolatile memory device according to claim 2, wherein:

the unit transistor elements of the first conductive type that comprise the first transistor, the second transistor, the third transistor and the fourth transistor are arranged in a common first well area; and the unit transistor elements of the second conductive type that comprise the fifth transistor and the sixth transistor are arranged in a common second well area.

8. A system, comprising:
a processor;
a cache;
a user input component; and
a flash memory comprising:

a first current detecting circuit comprising a first transistor of a first conductive type coupled in a diode configuration, wherein current flows according to a reference cell through the first transistor;

a second current detecting circuit comprising a second transistor of the first conductive type coupled in a diode configuration, wherein current flows according to a selected memory cell through the second transistor;

a bias circuit comprising a third transistor of the first conductive type that is coupled to the first transistor by a current mirror configuration; and a differential amplifying circuit comprising a fourth transistor of the first conductive type which is coupled to the second transistor, wherein the differential amplifying circuit outputs a signal corresponding to a difference between current flowing through the third transistor and current flowing through the fourth transistor; and wherein the first transistor, the second transistor, the third transistor and the fourth transistor are comprised of one predetermined sized unit transistor element of the first conductive type, or are comprised of parallel couplings of predetermined sized unit transistor elements of the first conductive type.

9. The system as recited in claim 8 wherein the system is a portable media player.

10. The system as recited in claim 8 wherein the system is a wireless communications device.

11. The system as recited in claim 8 wherein the system is a computing device.

12. The system as recited in claim 8, wherein said memory is NAND flash memory.

13. The system as recited in claim 8, wherein said memory is NOR flash memory.

14. The system as recited in claim 8, wherein said memory is flash memory that comprises at least one memory cell operable to store more than one bit.

* * * * *